US006514345B1

(12) United States Patent
Nagata et al.

(10) Patent No.: US 6,514,345 B1
(45) Date of Patent: Feb. 4, 2003

(54) PROCESSING APPARATUS AND MANAGING METHOD OF OPERATIONAL CONDITION PARAMETER THEREOF

(75) Inventors: Masaya Nagata, Santa Clara, CA (US); Masahiro Sugawara, Esashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/667,001

(22) Filed: Sep. 21, 2000

Related U.S. Application Data (63) Continuation of application No. PCT/JP00/05611, filed on Aug. 22, 2000.

(30) Foreign Application Priority Data

Sep. 1, 1999 (JP) ............................................ 11-247464

(51) Int. Cl.[7] ............................................. B05C 11/00
(52) U.S. Cl. ..................................................... 118/697
(58) Field of Search .................. 438/14, 770; 700/218; 118/697

(56) References Cited

U.S. PATENT DOCUMENTS

| | | | |
|---|---|---|---|
| 4,630,273 A | 12/1986 | Inoue et al. | |
| 4,951,190 A | 8/1990 | Lane et al. | |
| 4,967,381 A | * 10/1990 | Lane | ........................ 364/188 |
| 5,469,361 A | 11/1995 | Moyne | |
| 5,838,565 A | 11/1998 | Hsieh et al. | |
| 6,258,169 B1 | * 7/2001 | Asano | ........................ 118/697 |

FOREIGN PATENT DOCUMENTS

| | | |
|---|---|---|
| EP | 877 308 | 11/1998 |
| JP | 58-44784 | 3/1993 |
| JP | 8-129407 | 5/1996 |

* cited by examiner

*Primary Examiner*—John F. Niebling
*Assistant Examiner*—André C. Stevenson
(74) *Attorney, Agent, or Firm*—Pillsbury Winthrop LLP (57) ABSTRACT

A semiconductor manufacturing apparatus is improved so that apparatus operating condition parameters can be restored to setting values of various levels such as standard, apparatus delivery time or client oriented setting values even if the parameters are overwritten. The semiconductor manufacturing apparatus is constituted by a multi-chamber processing system 4, a transport system 8 of an object and an equipment control unit 210 having a memory apparatus 214 storing the apparatus operating condition parameters and providing the parameters to machine control units 150, 72. The machine control units 150, 72 controls the processing system 4 and the transport system 8 based on the apparatus operating condition parameters. The equipment control system 210 stores the apparatus operating condition parameters in the memory apparatus 214 for each level provided with a priority level from a standard level peculiar to the apparatus to a specific level peculiar to a user, and the equipment control system 210 develops the apparatus operating condition parameters stored in the memory apparatus on a memory 210 of the machine control units 150, 72 in an order of priority levels.

10 Claims, 6 Drawing Sheets

PROCESSING APPARATUS AND MANAGING METHOD OF OPERATIONAL CONDITION PARAMETER THEREOF

This is a continuation of application No. PCT /JP00/ 05611 filed Aug. 22, 2000.

TECHNICAL FIELD

The present invention relates to a control apparatus and a control method for controlling a semiconductor manufacturing apparatus in a semiconductor manufacturing process and, more particularly, to a method and apparatus for managing apparatus operating condition parameters for adjusting operating conditions of a semiconductor manufacturing apparatus.

BACKGROUND ART

Generally, a semiconductor manufacturing apparatus is a combination of various process chambers each of which performs a semiconductor device manufacturing process, and a transport mechanism, which conveys wafers, is provided between the process chambers and between a cassette that accommodates many wafers and a process chamber.

There are many apparatus operating condition parameters that correspond to a plurality of process chambers and a transport mechanism so that the process chambers and the transport mechanism can adjust the operational conditions of a semiconductor manufacturing apparatus in response to the ordered specifications and the purpose of use of a user.

Additionally, the semiconductor manufacturing apparatus may have a multi-chamber structure as mentioned above, and may be provided with an equipment control device for generally controlling the apparatus in response to the transport mechanism being provided thereto. Additionally, there is a case in which the equipment control device does not only control one semiconductor manufacturing apparatus but also generally control a plurality of semiconductor manufacturing apparatuses. As mentioned above, the semiconductor manufacturing apparatus and a system including semiconductor manufacturing apparatuses have become complicated, and it is desired to efficiently manage the apparatus operating condition parameters of a semiconductor manufacturing apparatus. In this case, the equipment control device is connected to a control device (hereinafter, may be referred to as a machine control device) of the process chambers and the transport mechanism via a network so as to exchange various kinds of information including the apparatus operating condition parameters with the machine device.

Accordingly, conventionally, the apparatus operating condition parameters are stored in a memory apparatus such as a memory apparatus attached to the machine control apparatus or a hard disk apparatus that can be accessed by the machine control apparatus.

Each machine control apparatus has a first memory such as a ROM for storing apparatus control programs and a second memory such as a RAM for storing apparatus operating condition parameter executing table that accommodates the apparatus operating condition parameters referred to by the apparatus control programs during operation. Additionally, each machine control apparatus develops in the above-mentioned second memory via the machine control apparatus the apparatus operating condition parameters stored in the memory apparatus attached to the machine control apparatus or the apparatus operating condition parameters that have been stored in the memory apparatus attached to the machine control apparatus by executing the initialization program.

As mentioned above, according to the conventional technique, the apparatus operating condition parameters are collectively managed, that is, integrally stored in the memory apparatus, and are integrally developed in the second memory of the machine control apparatus.

However, the apparatus operating condition parameters are changed during operation in the delivered party or when version upgrade is made. That is, the apparatus operating condition parameters are adjusted to the standard setting values when the semiconductor manufacturing apparatus is produced, and then adjusted to conform to the order specifications or apparatus specifications at the delivery time. Additionally, a part of the apparatus operating condition parameters may be reset at the delivered site of the semiconductor manufacturing apparatus so as to conform to the operational conditions of the client. As an example, when the client changes the number of arms of the transport mechanism, the standard setting value or the setting value at the delivery time is overwritten by the reset at the delivered site.

However, for example, when the version of the apparatus control programs are upgraded, there may be a case in which the apparatus operating condition parameters must be set back to the setting value at the delivery time or the standard value so as to perform an inspection or initialization of the upgraded apparatus control program. In such a case, since the apparatus operating condition parameters that have been reset at the delivered site are deleted, the apparatus operating condition parameters that have been reset at the delivered site must be memorized so as to perform an input operation of the client oriented setting values after the version upgrade is completed. Such a resetting operation is inconvenient for the operator, and there is a problem in that operation errors of the semiconductor manufacturing apparatus may occur due to input errors.

DISCLOSURE OF INVENTION

In view of the above-mentioned problems of the prior art, it is an object of the present invention to provide a managing method of apparatus operating condition which method can restore the apparatus operating condition parameters to setting values of various levels such as standard setting values, delivery setting values or client oriented setting values even if the apparatus operating condition parameters are overwritten, and to provide a semiconductor manufacturing apparatus which executes the managing method.

Additionally, it is another object of the present invention to provide a recording medium which records a program which can be executed by a controller or a computer of the above-mentioned semiconductor manufacturing apparatus so as to perform the managing method of the apparatus operating condition parameters of the semiconductor manufacturing apparatus.

In order to achieve the above-mentioned objects, the present Invention is based on the idea to classify the apparatus operating condition parameters of the semiconductor manufacturing apparatus into levels corresponding to conditions of the semiconductor manufacturing apparatus and to manage a difference in the apparatus operating condition parameters between the classified levels, that is, to manage information about addition or deletion of the parameters themselves.

The semiconductor manufacturing apparatus of the present invention recited in claim 1 comprises: a processing system including at least one process chamber which performs a semiconductor manufacturing process; a transport system carrying an object to be processed in or out of said process chamber of said processing system; and an equipment control system electrically connected to a machine control unit of said processing system and said transport system and having a memory apparatus for storing an apparatus control program and apparatus operating condition parameters, the equipment control system providing the apparatus control program and the apparatus operating condition parameters to said machine control unit, said machine control unit controlling said processing system and said transport system based on said apparatus control program provided by said machine control system and said apparatus operating condition parameters developed on a memory. The semiconductor manufacturing apparatus of the present invention is characterized in that said machine control system stores said apparatus operating condition parameters in said memory apparatus for each level provided with a priority level from a standard level peculiar to said semiconductor manufacturing apparatus to a specific level peculiar to a user of said semiconductor manufacturing apparatus; and said machine control system develops said apparatus operating condition parameters, which are stored in said memory apparatus of said machine control system, on said memory of said machine control unit in response to a priority level of a set of said parameters.

A method for managing apparatus operating condition parameters in a semiconductor manufacturing apparatus recited in claim 2 comprises: a processing system including at least one process chamber which performs a semiconductor manufacturing process; a transport system carrying an object to be processed in or out of said process chamber of said processing system; and an equipment control system electrically connected to a machine control unit of said processing system and said transport system and having a memory apparatus for storing an apparatus control program and apparatus operating condition parameters, the equipment control system providing the apparatus control program and the apparatus operating condition parameters to said machine control unit, said machine control unit controlling said processing system and said transport system based on said apparatus control program provided by said machine control system and said apparatus operating condition parameters developed on a memory, characterized by: a step of storing said apparatus operating condition parameters in said memory apparatus for each level provided with a priority level from a standard level peculiar to said semiconductor manufacturing apparatus to a specific level peculiar to a user of said semiconductor manufacturing apparatus; and a step of developing said apparatus operating condition parameters, which are stored in said memory apparatus of said machine control system, on said memory of said machine control unit in response to a priority level of a set of said parameters.

The method for managing apparatus operating condition parameters according to the present invention recited in claim 3 is characterized in that the step of developing said apparatus operating condition parameters on said memory in an order of priority of sets of said parameters includes: a step of developing a set of parameters having a highest priority level on said memory; and a step of developing a set of parameters having a next higher priority level on said memory so that the parameters of the same items as the parameters already developed on said memory are overwritten until a set of parameters having a next higher priority is not obtained from said memory apparatus.

The method for managing apparatus operating condition parameters according to the present invention recited in claim 4 is characterized in that the step of developing said apparatus operating condition parameters on said memory in an order of priority of sets of said parameters includes: a step of developing a set of parameters having a lowest priority level on said memory; and a step of developing on said memory the parameters other than the parameters of the same items as the parameters already developed on said memory from among the set of parameters having a next lower priority level until the set of the parameters having a next lower priority is not obtained from said memory apparatus.

Additionally, the invention related to claim 5 is a computer readable recording medium storing a program for managing apparatus operating condition parameters in a semiconductor manufacturing apparatus, and the program includes:

a code for causing said apparatus operating condition parameters being classified into levels each of which is provided with a priority level from a standard level peculiar to said semiconductor manufacturing apparatus to a specific level peculiar to a user of said semiconductor manufacturing apparatus; and a code for causing said apparatus operating condition parameters, which are classified into said levels, being developed on said memory (102) of said machine control unit ($150_1, \ldots 150_n$, 72) in an order of priority levels of a set of said parameters.

According to the invention relates to the above-mentioned claims 1 through 5, the storing area of the memory apparatus such as a hard disc for storing the apparatus operating condition parameters are classified into levels provided with a priority level such as "storing area of a standard setting value", "storing area of a delivery time setting value2 or "storing area of a client oriented setting value". Accordingly, in a case in which the client oriented setting value is input after the apparatus operating condition parameters are reset to the delivery time setting values due to a version upgrade of the program and then the version upgrade is completed, advantages can be obtained in that the actual values of the apparatus operating condition parameters can be restored to the standard setting values, the delivery time setting values or the client oriented setting values any time, and the data set by overwriting cannot be rewritten.

Other objects, features and advantages of the present invention will become more apparent from the following detailed description when read in conjunction with the accompanying drawings.

BEST MODE FOR CARRYING OUT THE INVENTION

A description will now be given below, with reference to the accompanying drawings, of an embodiment of a semiconductor manufacturing apparatus according to the present invention.

Figure 1:
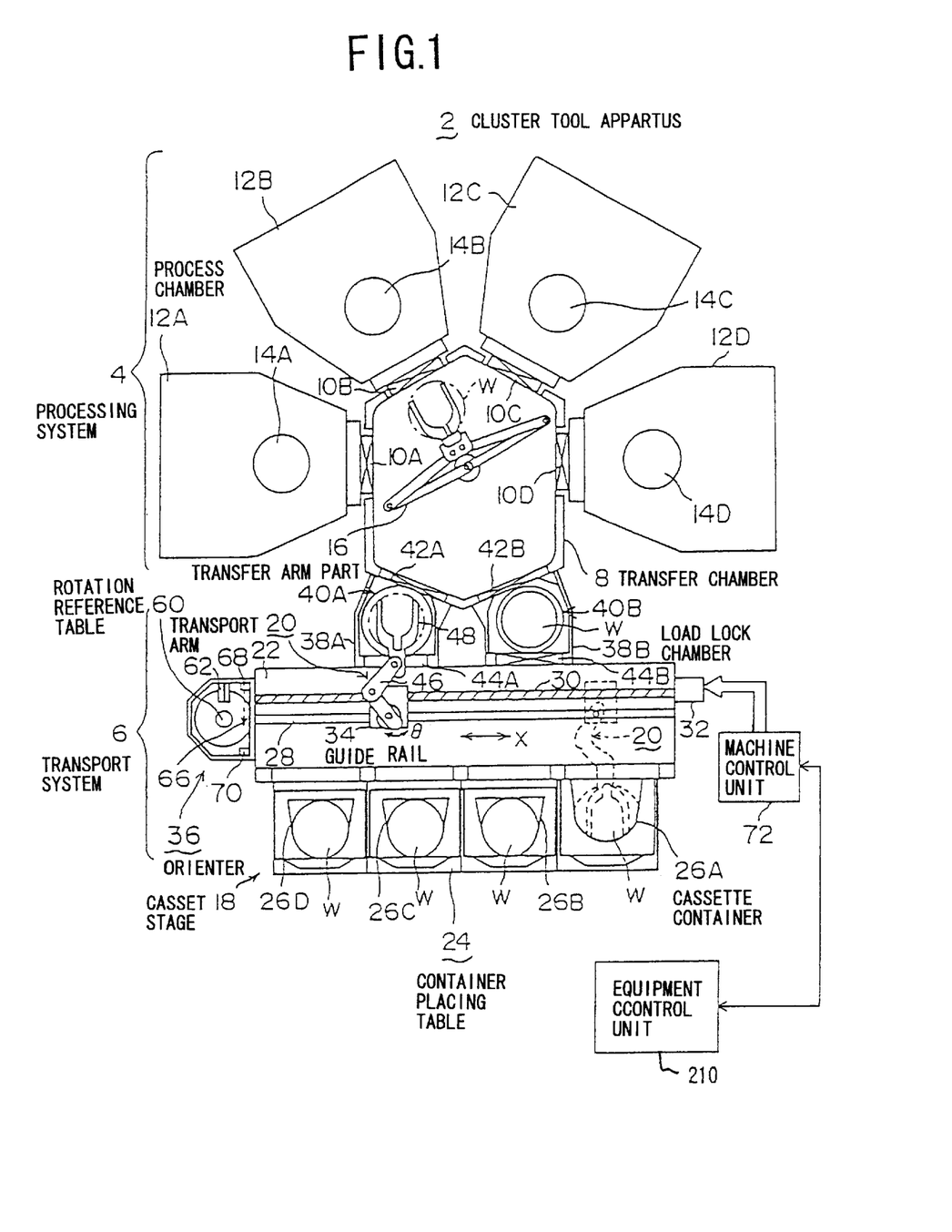
FIG. 1 is a view showing a mechanical part of an embodiment of a semiconductor manufacturing apparatus according to the present invention.

FIG. 1 is a view showing a mechanical part of the embodiment of the semiconductor manufacturing apparatus according to the present invention. A description will be given, with reference to FIG. 1, of the multi-chambered semiconductor manufacturing apparatus, especially of a cluster tool apparatus 2. The cluster tool apparatus 2 comprises: a processing system 4 which performs various processes such as a film deposition process, a diffusion process or an etching process with respect to a semiconductor wafer W as an object to be transported; and a transport system 6 which carries the wafer in or out of the processing system 4.

The processing system 4 comprises a transfer chamber 8 in which a vacuum can be formed and four process chambers 12A–12D that are connected via gate valves 10A–10D, and the same kind or different kinds of heat treat is performed on the wafer W. Susceptors 14A–14D for placing the wafer W are provided in the respective chambers 12A–12D. Additionally, a transfer arm part 16, which is bendable and pivotable, is provided in the transfer chamber 8 so as to transfer the wafer between the chambers 12A–12D or between the load lock chamber described later.

On the other hand, the transport system 6 comprises a cassette stage 18 for placing a cassette container and a transport stage 22 which moves a transport arm 20 for conveying and transferring the wafer W. The cassette stage 18 is provided with a container placing table 24 on which a plurality of cassette containers, for example, four cassette containers 26A–26D shown in the figure can be placed. Maximum of, for example, 25 wafers W can be accommodated in each of the cassette containers 26A–26D by being placed at an equal pitch.

The transport stage 22 is provided with a guide rail 28 extending in the center portion thereof along the longitudinal direction, and the above-mentioned transport arm 20 is slidably supported on the guide rail 28. A ball screw 30 as a moving mechanism is provided parallel to the guide rail 28, and a base part 34 of the above-mentioned transport arm 20 is engaged with the ball screw 30. Accordingly, the transport arm 20 is moved along the guide rail 28 by rotating a drive motor provided to an end of the ball screw.

Additionally, an orienter 36 is provided on the other end of the transport stage 22 as a directional positioning apparatus for positioning the wafer, and further, two load lock chambers 38A and 38B, in which a vacuum can be formed, are provided in the middle of the transport stage 22 so as to connect the transport stage 22 to the transfer chamber 8. placing tables 40A and 40B for placing the wafer W are provided in the load lock chambers 38A and 38B, respectively, and gate valves 42A and 42B and 44A and 44B are provided in front and rear of each of the load lock chambers 38A and 38B, respectively, so as to connect the load lock chambers 38A and 38B to the transfer chamber 8 or the transport stage 22.

The above-mentioned transport arm 20 comprises a transport arm body 46, which is multi articulated to be bendable, and a folk 48 mounted on an end of the arm body 46 so that the wafer W is directly supported on the folk 48.

The orienter 36 has a rotation reference table 60, which is rotated by a drive motor, and rotates in a state in which the wafer W is placed thereon. An optical sensor 62 is provided on a periphery of the rotation reference table 60 so a to detect the circumferential edge of the wafer W. Additionally, a level detector is provided on an inlet side of the orienter 36, the level detector comprising a laser element 68 for outputting a horizontal level detecting laser beam 66 and a light-receiving element 70 fro receiving the laser beam.

Additionally, the cluster tool apparatus 2 has a machine control unit 72 for transport system so as to control operations of the entire apparatus, and positional information with respect to each axis and information obtained by each detecting part are gathered so as to control transportation of the wafer W.

Figure 2:
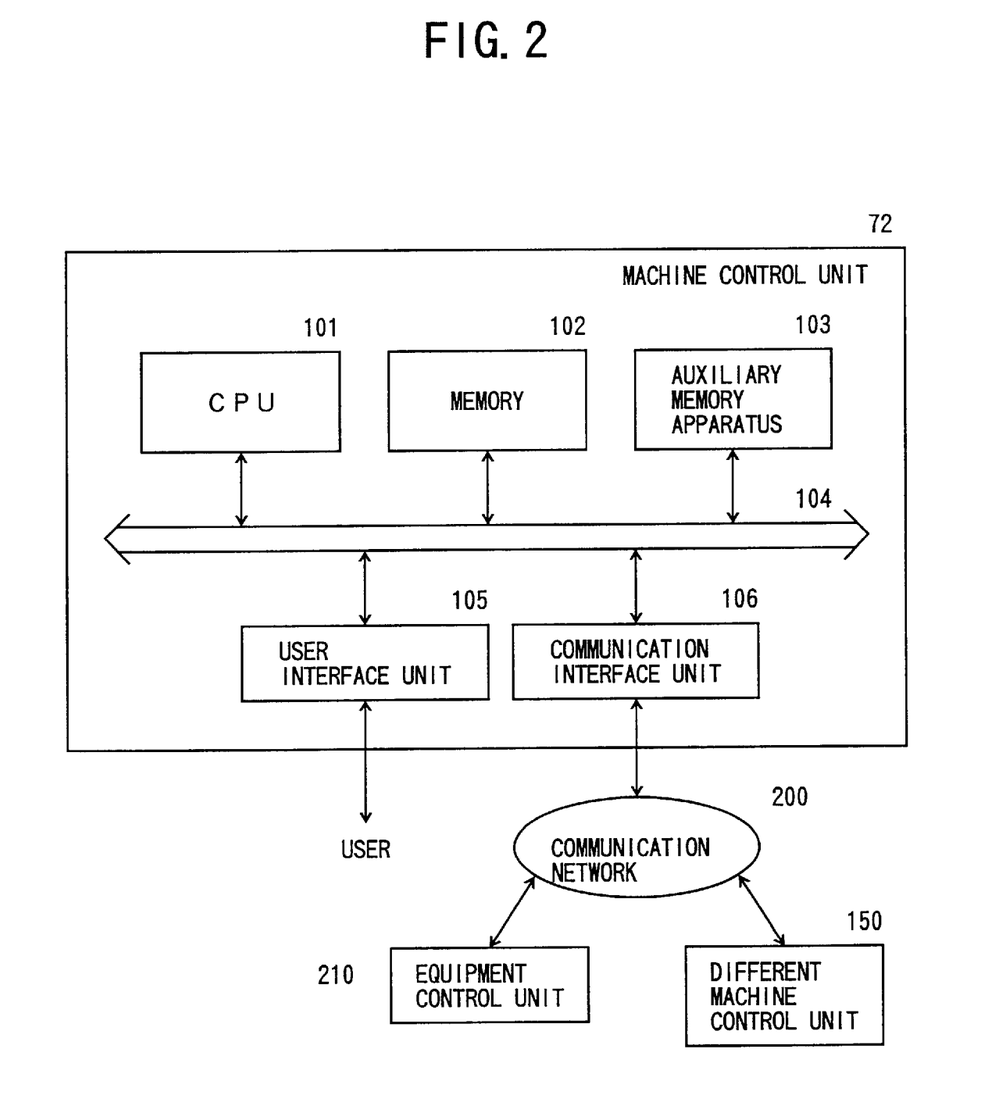
FIG. 2 is a block structural diagram of an example of a machine control unit.

FIG. 2 is a block structural diagram showing an example of the machine control unit 72 for the transport system. The machine control unit 72 for the transport system has a memory 102 constituted by, for example, a flash memory, EPROM, EEROM or the like, and the memory 102 stores an apparatus control program and the apparatus operating condition parameters are developed on the memory 102. The CPU 101 executes the apparatus control program stored in the memory 102 so as to control the apparatus while referring to the actual values of the apparatus operating condition parameters developed on the memory 102. The machine control unit 72 further comprises an auxiliary memory apparatus 103, which comprises a memory card and a card leader, so that information to be used later can be stored therein. Additionally, the machine control unit 72 has a user interface unit 105 having an input part and a display part so that the user can issue an instruction to the machine control unit 72 via the user interface unit 105 or the user can see a message from the machine control unit 72. Further, the machine control unit 72 has a communication interface unit 106 connected to a communication network (or a bus) 200 so that transfer of information can be performed between the equipment control unit 210 or a different machine control unit 150. According to an embodiment of the present invention, the apparatus operating condition parameters developed on the memory 102 of the machine control unit 72 are downloaded from the equipment control unit 210.

Figure 3:
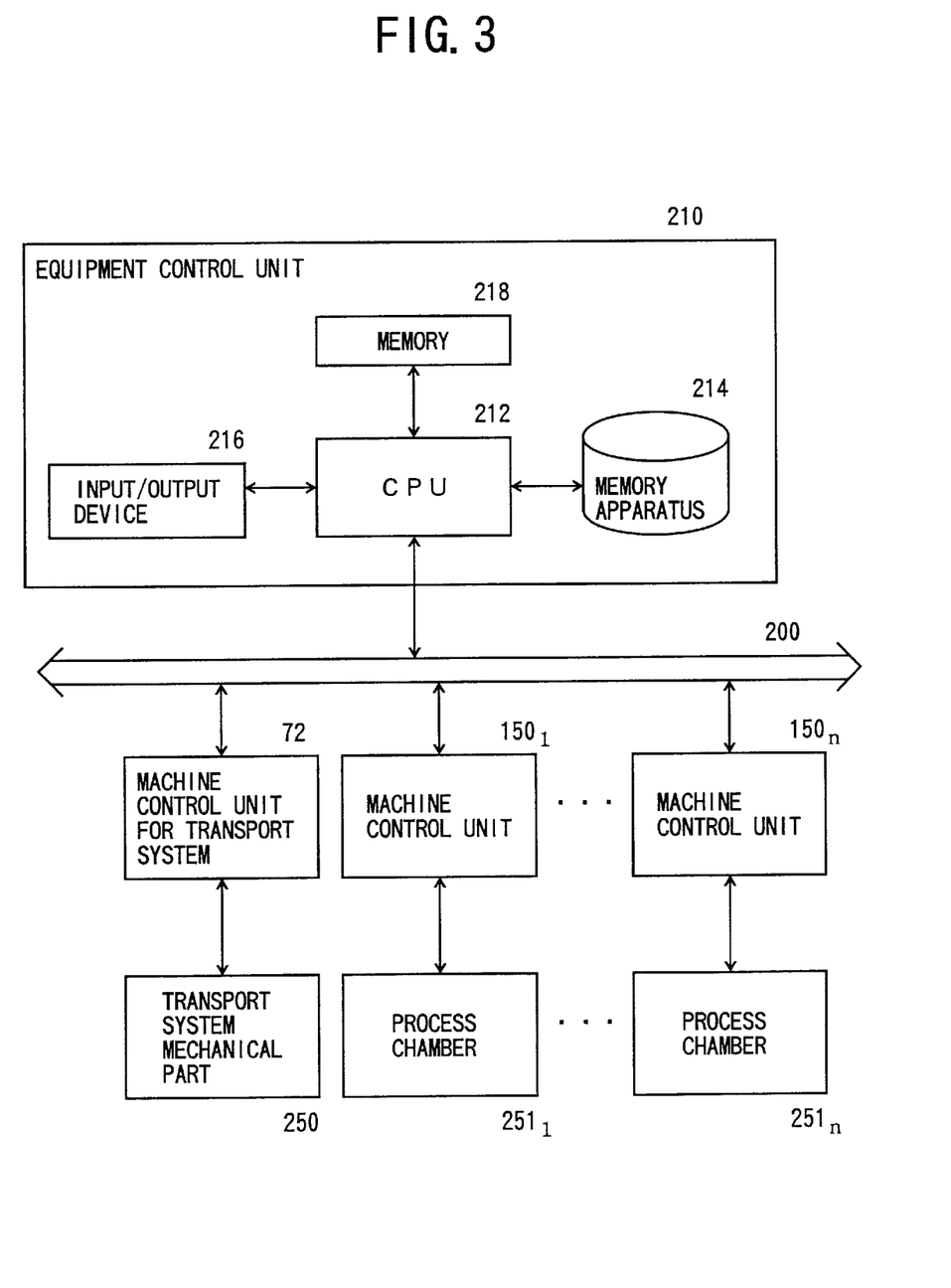
FIG. 3 is a diagram showing a control system of an embodiment off a semiconductor manufacturing apparatus according to the present invention.

FIG. 3 is a diagram showing a control system of an embodiment of the semiconductor manufacturing apparatus according to the present invention. The control system of the semiconductor manufacturing apparatus comprises: the equipment control unit 210, a machine control unit 72 for a transport system; different machine control units $150_1, \ldots 150_n$; and the network or bus 200 interconnecting between the above-mentioned equipment control unit 210, the above-mentioned machine control unit 72 for the transport system and the different machine control units $150_1, \ldots 150_n$.

The equipment control unit 210 is provided for integrally managing information of the entire semiconductor manufacturing apparatus, and can be connected to, for example, a host computer (not shown in the figure) of a plant in which the semiconductor manufacturing apparatus is installed.

The equipment control unit 210 has a memory apparatus 214 such as a hard disc apparatus, a floppy disc apparatus or an IC memory apparatus so as to store various kinds of information necessary for operations of the semiconductor manufacturing apparatus. The memory apparatus 214 stores a program for operation of the equipment control unit 210, an apparatus operation program executed by the machine control unit 72 for operation of the transport system and corresponding apparatus operating condition parameters or an apparatus operation program executed by the machine control units $150_1, \ldots 150_n$ for controlling the processes of the process chambers $251_1, \ldots 251_n$ and files of the corresponding apparatus operating condition parameters, a recipe peculiar to a user and log data of the apparatus. The equipment control unit 210 has a CPU 212 for executing the above-mentioned program, and obtain various kinds of information by downloading to the machine control units 72, $150_1, \ldots 150_n$ via the network 200 and stores the information in the memory 218 or the memory apparatus 214. The equipment control unit 210 further comprises an input/output device 216 constituted by a display and a keyboard so that the user can set or edit various programs and parameters stored in the above-mentioned memory apparatus 214 via the input/output device 216.

According to the embodiment of the semiconductor manufacturing apparatus of the present invention, as levels of the above-mentioned apparatus operating parameters provided with a priority level from the standard level peculiar to the above-mentioned semiconductor manufacturing apparatus to the specific level peculiar to a user of the above-mentioned semiconductor manufacturing apparatus, there are provided (1) a set of standard setting values that are parameters peculiar to the above-mentioned semiconductor manufacturing apparatus, (2) a set of setting values at the time of delivery of the apparatus that are the parameters at the delivery time of the above-mentioned semiconductor manufacturing apparatus and (3) a set of client oriented setting values that are parameters adjusted by the client of the above-mentioned semiconductor manufacturing apparatus. Generally, since the values of the parameters become more specific and detailed in the order of (1) the set of standard setting values, (2) the set of the apparatus delivery time setting values and (3) client oriented setting values, it is considered that the priority level is higher in the order of (1), (2) and (3).

In the following description, as examples of the apparatus operating condition parameters, a consideration will be made of parameters that relate to the mechanical structure of the mechanical part of the transport system. As items of the parameters, for example, the following parameters are considered.

Figure 4:
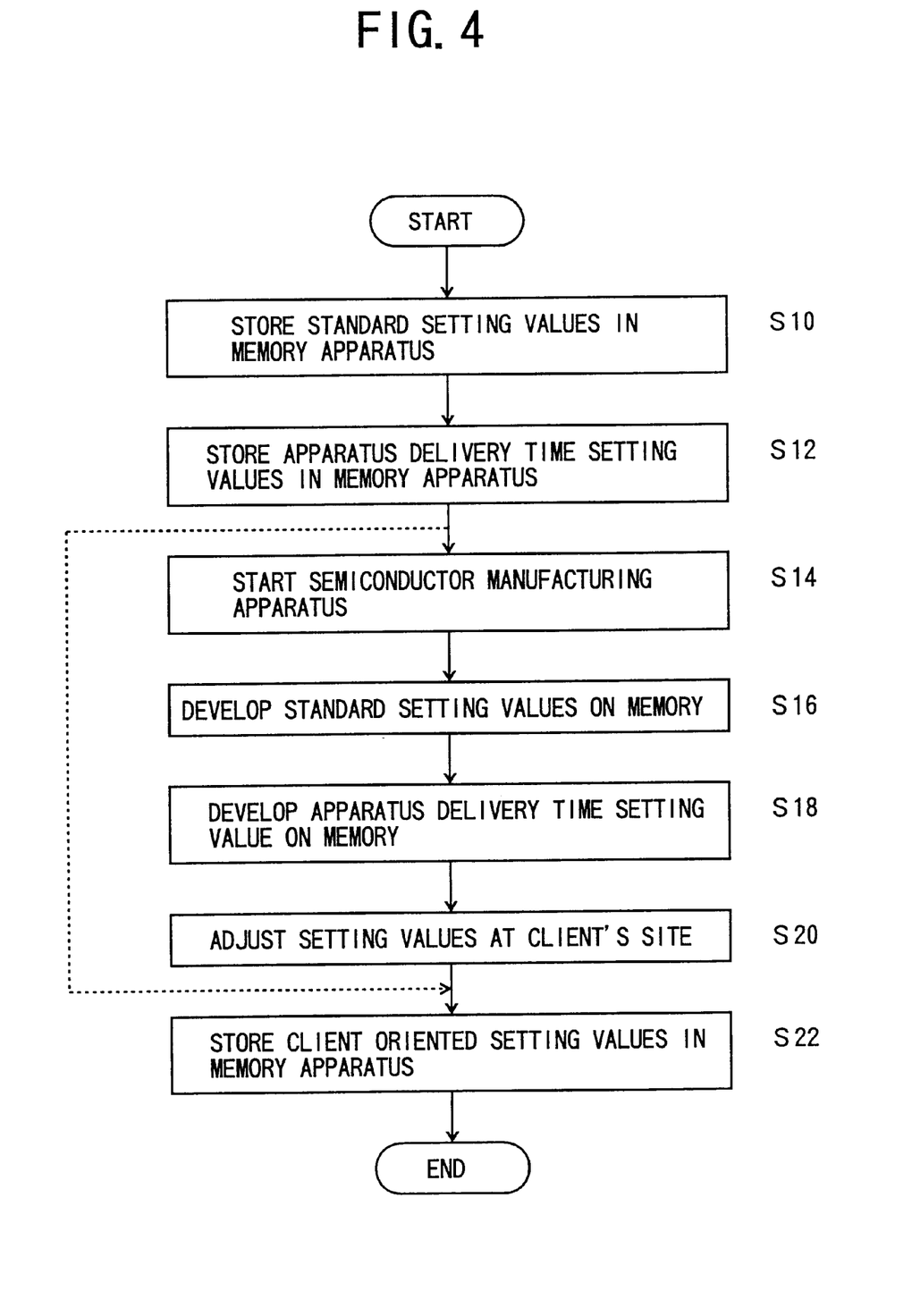
FIG. 4 is a flowchart for explaining an operation for storing apparatus operating condition parameters.

Parameter 1: number of arms
Parameter 2: maximum speed of first arm (mm/sec)
Parameter 3: maximum speed of second arm (mm/sec)
Parameter 4: length of guide rail (mm)
Parameter 5: number of stages of cassette A description will now be given of a managing method of the apparatus operating condition parameters performed in an embodiment of the semiconductor manufacturing apparatus according to the present invention. FIG. 4 is a flowchart of an example of an operation for storing the apparatus operating condition parameters.

In step 10, the following standard setting values which are determined according to the design specifications of the semiconductor manufacturing apparatus arte stored in the memory apparatus 214 via the input/output device 216 of the equipment control unit 210.

(1) set of standard setting values
Parameter 1=2
Parameter 2=500
Parameter 3=400
Parameter 4=1000
Parameter 5=4

Next, when the length of the guide rail is changed from 1000 mm to 800 mm in the order specifications, the following apparatus delivery time setting values, which are determined in accordance with the order specifications of the apparatus, are stored in the memory apparatus 214 in step 12.

(2) set of apparatus delivery time setting values
Parameter 1=2
Parameter 2=500
Parameter 3=400
Parameter 4=800
Parameter 5=4

Next, the semiconductor manufacturing apparatus delivered to the client is started (step 14). At this time, the client develops the (1) standard setting values on the memory of the machine control unit 72 for the transport system (step 16). Next, the 0(2) apparatus delivery time setting values are developed on the memory of the machine control unit 72 for the transport system. At this time, the set of setting values is developed so as to overwrite the (1) standard setting values that have already been developed on the memory (step 18). Thereby, the data developed on the memory of the machine control unit 72 for the transport system coincide with the (2) apparatus delivery time setting values.

Next, at the client's site, the apparatus operating condition parameters are adjusted while the semiconductor manufacturing apparatus is operated (step 20). For example, the number of stages of the cassette is changed from 4 to 3. Or, at the client's site, the number of arms is reduced from 2 to 1, or there may be a case in which a large change is applied to the transport system such that one arm is maintained to be fixed. In this case, the corresponding apparatus operating condition parameters are changed, and the changed data is stored as the (3) client oriented setting values in the memory apparatus 214. At this time, the (3) set of client oriented setting values that are determined in accordance with the purpose of use of the user is as follows.

Parameter 1=1
Parameter 2=500
Parameter 4=800
Parameter 5=3

Since the second arm is not needed due to the reduction of the number of arms to 1, attention must be paid to the fact that the parameter 3, which relates to the moving speed of the second arm, is not set. It should be noted that only the changed parameters may be stored, or a whole set of setting values may be stored Although, in the above-mentioned description, the set of client oriented setting values is stored in the memory apparatus 214 after the parameters are adjusted by actually operating the semiconductor manufacturing apparatus through the process of step 14–step 20, the set of client oriented setting values may be set to the memory apparatus 214 via the input/output device 216 of the equipment control unit 210 separately from the actual operation of the semiconductor manufacturing apparatus.

Next, a description will be given of an operation of the machine control unit 72 for the transport system to execute the apparatus control program with reference to the apparatus operating condition parameters developed on the memory 102 after the semiconductor manufacturing is started and the apparatus operating condition parameters are developed on the memory 102 of the machine control unit 72 for the transport system in a case in which the sets (1)–(3) of the setting values are stored in the memory apparatus 214 of the equipment control unit 210.

Figure 5:
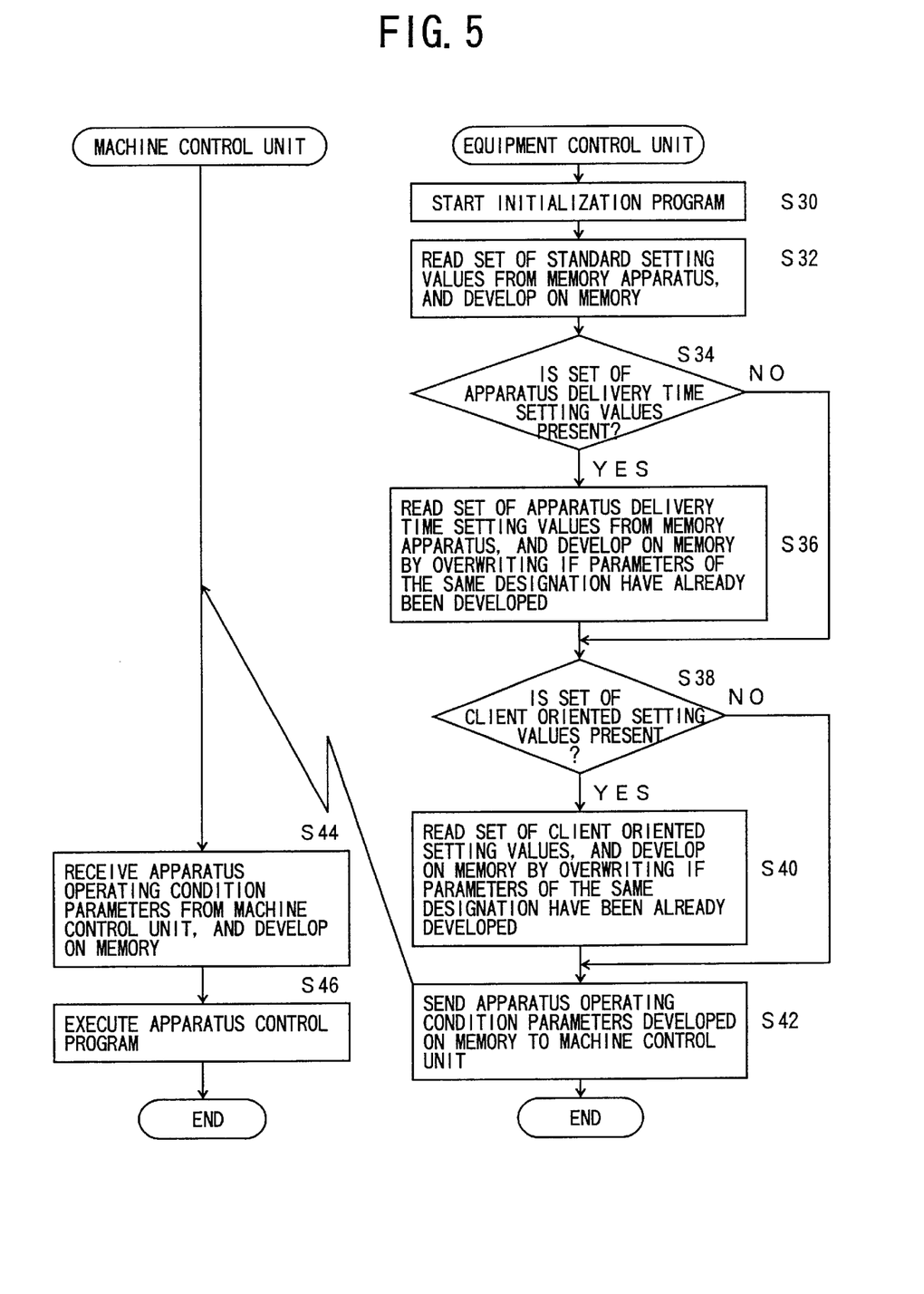
FIG. 5 is a flowchart for explaining a developing process of the apparatus operating condition parameters on a memory according to an embodiment of the present invention.

As a method for developing the apparatus operating condition parameters of three levels from the above-mentioned (1) to (3) on the memory 102 of the machine control unit 72 for the transport system, there are: (a) a method of writing final apparatus operating condition parameters in the memory 102 of the machine control unit 72 after developing the contents stored in the memory apparatus 214 of the equipment control unit 210 on the memory 218 in the order of higher priority level and sending the final apparatus operating condition parameters to the machine control unit 72; and (b) a method for developing the data on the memory 102 of the machine control unit 72 in an order of higher priority level by reading the data from the memory apparatus 214 of the machine control unit 210 in the order of higher priority level and sending the data to the machine control unit 72. In the following description, a description will be given in detail of the method (a), which has a higher communication efficiency. FIG. 5 is a flowchart of a developing process of the apparatus operating condition parameters on the memory according an embodiment of the present invention.

Step 30: In the equipment control unit 210, the CPU 212 starts the initialization program loaded in the memory 218. The initialization program is started when the semiconductor manufacturing apparatus is started in a case in which the apparatus operating condition parameters must be reset to the set of client oriented setting values when the apparatus operating condition parameters are returned to the set of the apparatus delivery time setting values due to an execution of a version update of the programs.

Step 32: The CPU 212 reads the set of the standard setting values from the memory apparatus 214, and develops on the memory 218, that is, write in the memory 218. At this time, the contents developed on the memory 218 are as follows.

Parameter 1=2
Parameter 2=500
Parameter 3=400
Parameter 4=1000
Parameter 5=4

Step 34: Next, the CPU 212 checks whether the set of the apparatus delivery time setting values is stored in the memory apparatus 214, and if it is stored, the routine proceeds to step 36, and if it is not stored, the routine proceeds to step 38.

Step 36: The CPU 212 reads the set of the apparatus delivery time setting values from the memory apparatus 214, and the CPU develops the set of the setting values on the memory 218 in a mode in which if the parameter having the same designation has already been developed on the memory 218, the parameter is overwritten and if there is no parameter having the same designation developed, the parameter is added. At this time, the contents in the memory 218 are as follows.

Parameter 1=2
Parameter 2=500
Parameter 3=400
Parameter 4=800
Parameter 5=4

Step 38: Next, the CPU 212 checks whether the set of the client oriented setting values is stored in the memory apparatus 214, and if it is stored, the routine proceeds to step 40, and if it is not stored, the routine proceeds to step 42.

Step 40: The CPU 212 reads the set of the client oriented setting values from the memory apparatus 214, and the CPU 212 develops the set of the setting values on the memory 218 in a mode in which if the parameter having the same designation has already been developed on the memory 218, the parameter is overwritten and if there is no parameter having the same designation developed, the parameter is added. At this time, the contents in the memory 218 are as follows.

Parameter 1=1
Parameter 2=500
Parameter 3=400
Parameter 4=800
Parameter 5=3

Step 42: Next, the CPU 212 of the equipment control unit 210 sends the apparatus operating condition parameters developed on the memory 218 to the machine control unit 72 for the transport system in accordance with a predetermined protocol.

Step 44: the CPU 101 of the machine control unit 72 develops the apparatus operating condition parameters, which have been sent from the equipment control unit 210 in accordance with the predetermined protocol, on the memory 102.

Step 46: The CPU 101 of the machine control unit 72 executes the apparatus control program with reference to the apparatus operating condition parameters developed on the memory 102, the apparatus operating condition parameters being as follows.

Parameter 1=1
Parameter 2=500
Parameter 3=400
Parameter 4=800
Parameter 5=3

It should be noted that although, in the above description, the equipment control unit 210 is connected to the machine control unit 72 for the transport system via the network, both the equipment control unit 210 and the machine control unit 72 for the transport system may be achieved on the same computer so that the machine control unit 72 for the transport system directly reads the apparatus operating condition parameters from the memory apparatus 214 and develops the apparatus operating condition parameters on the memory.

Figure 6:
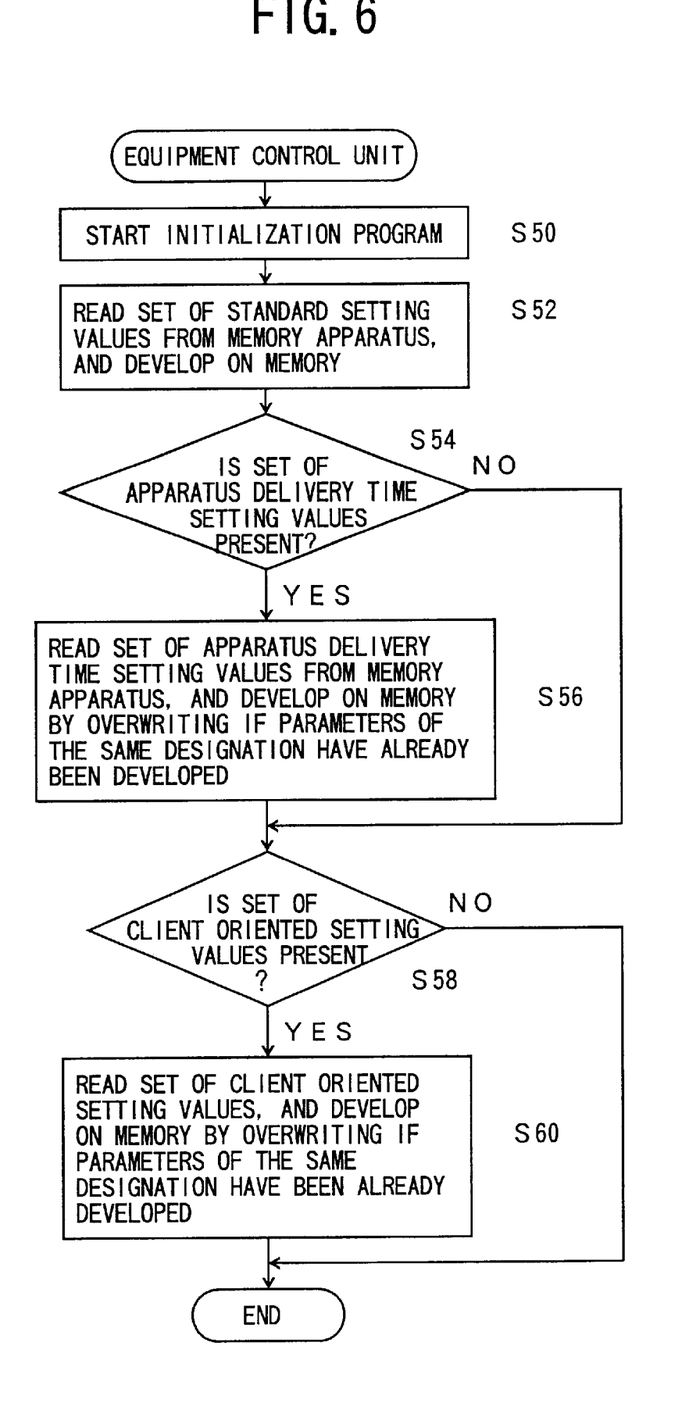
FIG. 6 is a flowchart for explaining a developing process of the apparatus operating condition parameters on a memory according to another embodiment of the present invention.

Additionally, in the embodiment of the present invention, as an order of developing the apparatus operating condition parameters on the memory, a set of parameters having the highest priority level is developed on the memory first, and, then, the set of the parameters having a next higher priority level is developed on the memory so that a parameter of the same item as the parameter already been developed on the memory is overwritten until a set of the parameters having a next higher priority level cannot be obtained from the memory apparatus. However, the order of developing the apparatus operating condition parameters can be reversed. That is, a set of parameters having the lowest priority level is developed on the memory first, and, then, a parameter other than parameters of the same priority level that have already been developed on the memory from among the set of the parameters having a next lower priority level is developed on the memory until a set of the parameters having a next lower priority level cannot be obtained from the memory apparatus, and, thereby, the apparatus operating condition parameters can be developed on the memory in an order of priority level of the set of the parameters.

Additionally, the control system performing the management of the apparatus operating condition parameters of the semiconductor manufacturing apparatus according to the present invention can construct each of eh structural requirements by software (program) and stores the software in a disc apparatus or the like so that the apparatus operating condition parameters can be managed by installing the software on a computer if necessary. Further, the constructed program can be stored in a portable recording medium such as a floppy disc or a CD-ROM so that the program is generally used in a case in which the apparatus operating condition parameters are managed.

The present invention is not limited to the specifically disclosed embodiments, and variations and modifications may be made without departing form the scope of the present invention.

What is claimed is:

1. A processing apparatus comprising:
    a processing system including at least one process chamber which performs a process;
    a transport system carrying an object to be processed in or out of said process chamber of said processing system; and
    an equipment control system electrically connected to a machine control unit of said processing system and said transport system and having a memory apparatus for storing an apparatus control program and apparatus operating parameters, the equipment control system providing the apparatus control program and the apparatus operating condition parameters to said machine control unit, wherein:
        said machine control unit controlling said processing system and said transport system based on said apparatus control program provided by said equipment control system and said apparatus operating condition parameters developed on a memory,
        said equipment control system stores said apparatus operating condition parameters in said memory apparatus for each level provided with a priority level from a standard level peculiar to said processing apparatus to a specific level peculiar to a user of said processing apparatus, and
        said equipment control system develops said apparatus operating condition parameters, which are stored in said memory apparatus of said equipment control system, on said memory of said machine control unit in response to a priority level of a set of said parameters.

2. A computer readable recording medium storing a program for managing apparatus operating condition parameters in a processing apparatus comprising:
    a processing system including at least one process chamber which performs a process;
    a transport system carrying an object to be processed in or out of said process chamber of said processing system; and
    an equipment control system electrically connected to a machine control unit of said processing system and said transport system and having a memory apparatus for storing an apparatus control program and apparatus operating condition parameters, the equipment control system providing the apparatus control program and the apparatus operating condition parameters to said machine control unit, wherein:
        said machine control unit controlling said processing system and said transport system based on said apparatus control program provided by said machine control system and said apparatus operating condition parameters developed on a memory, and
        said program includes:
            a code for causing said apparatus operating condition parameters being classified into levels each of which is provided with a priority level from a standard level peculiar to said processing apparatus to a specific level peculiar to a user of said processing apparatus; and
            a code for causing said apparatus operating condition parameters, which are classified into said levels, being developed on said memory of said machine control unit in an order of priority levels of a set of said parameters.

3. The processing apparatus of claim 1, wherein said equipment control system develops said apparatus operating condition parameters on said memory of said machine control unit based on an order of the priority levels of the set of said parameters.

4. The processing apparatus of claim 3, wherein said equipment control system comprises:
    means for developing a set of parameters having a highest priority level on said memory; and
    means for developing a set of parameters having a next higher priority level on said memory so that the parameters of the same items as the parameters already developed on said memory are overwritten until a set of parameters having a next higher priorty is not obtained from said memory apparatus.

5. The processing apparatus of claim 3, wherein said equipment control system comprises:
    means for developing a set of parameters having a lowest priority level on said memory; and
    means for developing on said memory a set of parameters other than the parameters of the same items as the parameters already developed on said memory from among the set of parameters having a next lower priority is not obtained from said memory apparatus.

6. The processing apparatus as claimed in claim 1, wherein said equipment control system comprises:
    means for developing a set of parameters having a high priority level on said memory; and
    means for developing a set of parameters having a next higher priority level on said memory so that the parameters of the same items as the parameters already developed on said memory are overwritten until a set of parameters having a next higher priority is not obtained from said memory apparatus.

7. The processing apparatus as claimed in claim 1, wherein said equipment control system comprises:
    means for developing a set of parameters having a lowest priority level on said memory; and
    means for developing on said memory a set of parameters other than the parameters of the same items as the parameters already developed on said memory from among the set of parameters having a next lower priority is not obtained from said memory apparatus.

8. A processing apparatus comprising:
    a processing system including at least one process chamber which performs a process;
    a transport system carrying an object to be processed in or out of said process chamber of said processing system; and
    an equipment control system electrically connected to a machine control unit of said processing system and said transport system and having a memory apparatus for storing an apparatus control program and apparatus operating condition parameters, said memory apparatus having a plurality of storing areas each of which is provided with a priority level from a standard level peculiar to said processing apparatus to a specific level peculiar to a user of said processing apparatus, wherein said equipment control system provides the apparatus control program and the apparatus operating condition parameters to said machine control unit, said machine control unit controls said processing system and said transport system based on said apparatus control program provided by said machine control system and said apparatus operating condition parameters developed on a memory, said equipment control system stores each of said apparatus operating condition parameters in one of the storing areas of said memory apparatus provided with a corresponding one of the priority level, and said equipment control system develops said apparatus operating condition parameters, which are stored in said memory apparatus of said machine control system, on said memory of said machine control unit in response to a priority level of a set of said parameters.

9. The processing apparatus as claimed in claim 8, wherein the storing areas of said memory apparatus include a storing area of a standard setting value, a storing area of a delivery time setting value and a storing area of a client oriented setting value.

10. A processing apparatus comprising:

a processing system including at least one process chamber which performs a process;

a transport system carrying an object to be processed in or out of said process chamber of said processing system; and an equipment control system electrically connected to a machine control unit of said processing system and said transport system and having a memory apparatus for storing an apparatus control program and apparatus operating condition parameters, the equipment control system providing the apparatus control program and the apparatus operating condition parameters to said machine control unit, wherein:

said machine control unit controls said processing system and said transport system based on said apparatus control program provided by said machine control system and said apparatus operating condition parameters developed on a memory, said equipment control system comprises:

means for storing said apparatus operating condition parameters in said memory apparatus for each level provided with a priority level from a standard level peculiar to said processing apparatus to a specific level peculiar to a user of said processing apparatus; and means for developing said apparatus operating condition parameters, which are stored in said memory apparatus of said machine control system, on said memory of said machine control unit in response to a priority level of a set of said parameters.

* * * * *